(12) United States Patent
Hensley et al.

(10) Patent No.: US 8,614,890 B2
(45) Date of Patent: Dec. 24, 2013

(54) CHASSIS EXTENSION MODULE

(75) Inventors: James D. Hensley, Rocklin, CA (US); David G. Rohrer, Auburn, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 290 days.

(21) Appl. No.: 13/088,526

(22) Filed: Apr. 18, 2011

(65) Prior Publication Data

US 2012/0262876 A1 Oct. 18, 2012

(51) Int. Cl.
*H05K 7/20* (2006.01)
*A47B 81/00* (2006.01)

(52) U.S. Cl.
USPC ........... 361/690; 361/687; 361/689; 361/692; 312/223.2

(58) Field of Classification Search
None
See application file for complete search history.

(56) References Cited

U.S. PATENT DOCUMENTS

| | | | | |
|---|---|---|---|---|
| 5,335,144 | A | * | 8/1994 | Maroushek .................... 361/695 |
| 6,359,218 | B1 | | 3/2002 | Koch |
| 6,749,070 | B2 | * | 6/2004 | Corbett et al. .................. 211/26 |
| 6,856,517 | B2 | * | 2/2005 | Keating et al. ................ 361/796 |
| 6,888,069 | B1 | * | 5/2005 | Chen et al. ................... 174/99 R |
| 6,932,443 | B1 | * | 8/2005 | Kaplan et al. ................. 312/213 |
| 6,968,958 | B2 | * | 11/2005 | Lauchner et al. ............... 211/26 |
| 6,982,872 | B2 | * | 1/2006 | Behl et al. ................ 361/679.31 |
| 7,012,806 | B2 | | 3/2006 | Jones |
| 7,457,112 | B2 | * | 11/2008 | Fukuda et al. .......... 361/679.48 |
| 7,821,790 | B2 | * | 10/2010 | Sharma et al. ................ 361/727 |
| 2005/0071534 | A1 | | 3/2005 | Kwatra |

FOREIGN PATENT DOCUMENTS

JP 2007280109 10/2007
JP 2007323519 12/2007

* cited by examiner

*Primary Examiner* — Boris Chervinsky

(57) ABSTRACT

A chassis extension module includes an extension housing structure and a support structure. The extension housing structure is to be attached to a housing structure of another module. Attachment of the extension housing structure to the housing structure of the other module expands an inner volume of an assembly.

21 Claims, 8 Drawing Sheets

CHASSIS EXTENSION MODULE

BACKGROUND

Electronic equipment, such as a computer server, a communications switch, a storage system, or other type of equipment, typically includes a chassis that contains electronic components of the electronic equipment. Different versions of a particular electronic equipment can be associated with different chassis configurations.

BRIEF DESCRIPTION OF THE DRAWINGS

Some embodiments are described with respect to the following figures.

DETAILED DESCRIPTION

A chassis for electronic equipment can have multiple different chassis configurations, such as different form factors (different chassis sizes). A "chassis" refers to the external housing of the electronic equipment, where the chassis defines an inner volume that is able to contain electronic components of the electronic equipment. The configuration of the chassis can vary with different versions of the electronic equipment. For example, a first version of the electronic equipment can include a first set of electronic components, which can be housed in a chassis having a first form factor. However, a second version of the electronic equipment can include a second, larger set of electronic components, which would have to be housed in a chassis having a second, different form factor. The chassis can be formed of a single integral housing section, or multiple discrete housing sections that are attached to each other. The chassis does not have to completely enclose the inner volume—instead, in some examples, the chassis can partially enclose the inner volume, with one or multiple sides of the chassis being without a housing section.

To manufacture chassis having different chassis configurations, a manufacturer typically has to use respective different tooling. "Tooling" refers to manufacturing equipment used to build a chassis of the electronic equipment, where the tooling can include automated manufacturing equipment or equipment for manual manipulation by humans. Examples of the tooling include tooling to manipulate sheet metal, plastic parts, and so forth. Having to maintain different tooling for different chassis configurations can be inefficient and can lead to increased costs.

In accordance with some implementations, instead of using different tooling for certain different chassis configurations, a modular approach of building a chassis is used. The modular approach according to some implementations involves use of a base module and a chassis extension module that is selectively attachable (and detachable in some implementations) to the base module (or to another chassis extension module) to allow for provision of different chassis configurations.

The base module has a base housing structure that is attachable to an extension housing structure of a chassis extension module. As used here, a "housing structure" refers to a frame, casing, or any other enclosing structure that is to enclose (fully or partially) a particular space, wherein the housing structure can include a single segment or multiple segments attached together.

Figure 1:
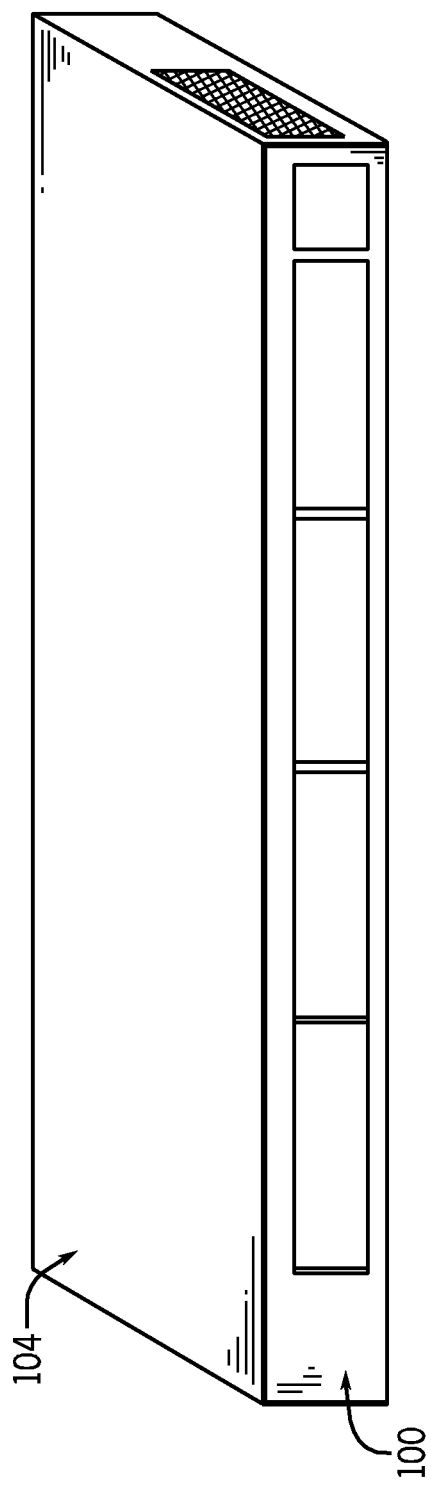
FIG. 1 is a perspective view of an assembly having a base module and a lid.

FIG. 1 illustrates a base assembly that has a base module 100 and a lid 104 that covers the base module 100. The base assembly of FIG. 1 has a first chassis configuration—for example, the first chassis configuration can have a height of 1 U. "U" refers to a unit of height as defined by a standard, such as by the Electronics Industry Association (EIA). In other examples, the respective heights of different chassis configurations can be measured in other ways.

Figure 2:
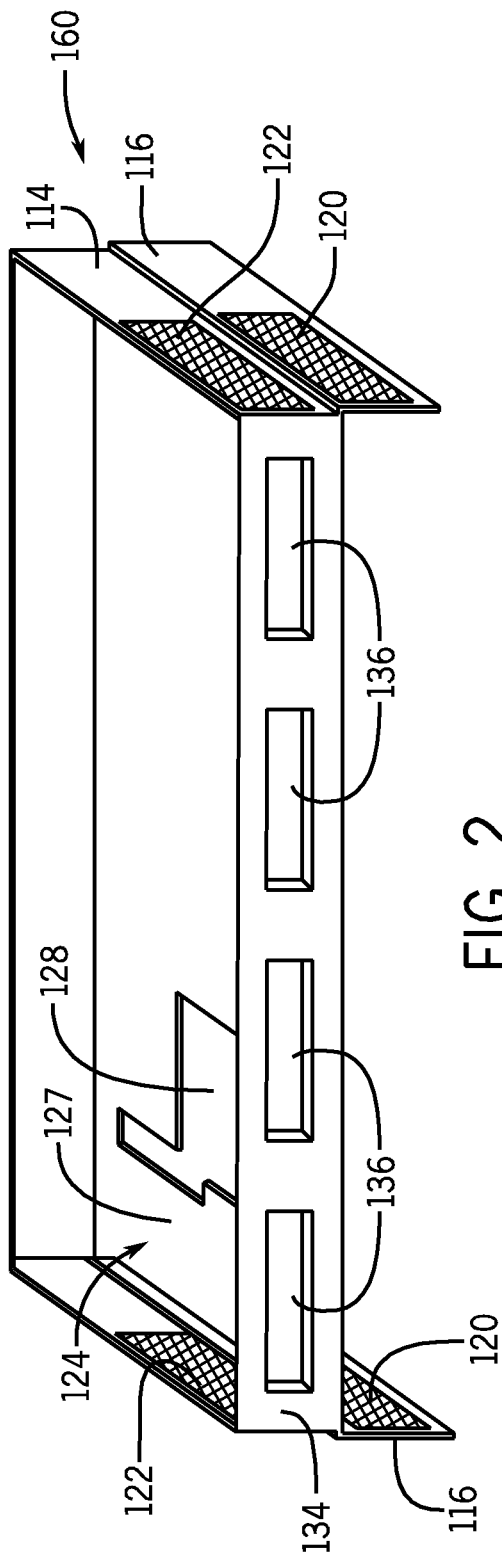
FIG. 2 is a perspective view of a chassis extension module according to some implementations.

FIG. 2 illustrates a chassis extension module 160 according to some implementations that is configured to be attached to another module, such as the base module 100 of FIG. 1 or another chassis extension module, by use of an attachment mechanism (e.g., screws, tabs, hooks, etc.). The chassis extension module 160 includes an extension housing structure 114 that has side portions, a front portion (134), and a rear portion.

The extension housing structure 114 of the chassis extension module 160 defines an inner volume 124 of the chassis extension module 160 in which components can be contained. When the chassis extension module 160 is added to an assembly, such as the base assembly depicted in FIG. 1, the composite inner volume of the assembly is expanded by the inner volume of the chassis extension module 160.

FIG. 2 further depicts a support structure 127 of the chassis extension module 160. Generally, a support structure refers to a structure for supporting components that are to be contained in the chassis extension module 160. The support structure 127 can be a mid-floor that is attached to the extension housing structure 114. Alternatively, the support structure 127 can be considered to be the bottom portion of the extension housing structure 114. Generally, the support structure 127 that is attached to the extension housing structure 114 can be a separate piece from the extension housing structure 114, or can be integrally formed with the extension housing structure 114.

The support structure 127 has an opening 128 (or multiple openings) that allow(s) for communication between the inner volume 124 of the chassis extension module 160 and the inner volume of another module that is part of the assembly in which the chassis extension module 160 can be provided.

Using the modular approach according to some implementations, different assemblies having respective different combinations of modules can be built by a manufacturer, using the same tooling, depending upon differing specifications of customers of the manufacturer. For example, a first specification can be met by an assembly including the base module without a chassis extension module; on the other hand, other specifications can be met by assemblies each having the base module with one or multiple chassis extension modules.

An assembly having multiple modules has a composite inner volume that is an aggregate of the inner volume of the base module and the inner volume(s) of the chassis extension module(s). The base assembly of FIG. 1 (which is without any chassis extension module) has a composite inner volume that is made up of just the inner volume of the base module.

Addition of a chassis extension module to an assembly expands the composite inner volume of the assembly by the inner volume of the chassis extension module, which can allow for inclusion of additional components (e.g., electronic components) into the assembly. Note that the expansion of the composite inner volume of the assembly can occur in the direction along the height of the assembly. Alternatively or additionally, the expansion of the composite inner volume of the assembly can occur in one or multiple other directions, such as along the width direction or depth direction of the assembly.

It is noted that expanding the inner volume of an assembly by addition of a chassis extension module means that the inner volume of the chassis extension module is added to the inner volume of another module (e.g., the base module or another chassis extension module) in such a way that the inner volumes of the modules are in communication with each other. Two inner volumes of different modules are considered to be "in communication" with each other if some path is defined between the modules to allow for airflow and/or an electrical medium and/or wireless signaling (e.g., infrared signaling) to be provided between the inner volumes of the different modules. It is noted that expanding the inner volume of an assembly does not refer to merely stacking one module on top of another module, where no communication is allowed between the inner volumes of the stacked modules to allow for airflow and/or passage of an electrical medium and/or communication of wireless signaling.

The side, front, and/or rear portions of the chassis extension module 160 can have corresponding connectors, ports or receptacles (such as 136 shown in FIG. 2) for connection to external device(s). In addition, the extension housing structure 114 has connection portions 116 that are designed to cover or otherwise engage with respective side portions of another module connected below the extension housing structure 114.

The connection portions 116 are provided with airflow openings 120, and the extension housing structure 114 is provided with airflow openings 122. The airflow openings 120 and 122 are configured to allow airflow between an inner volume of an assembly and an outside of the assembly.

Figure 3:
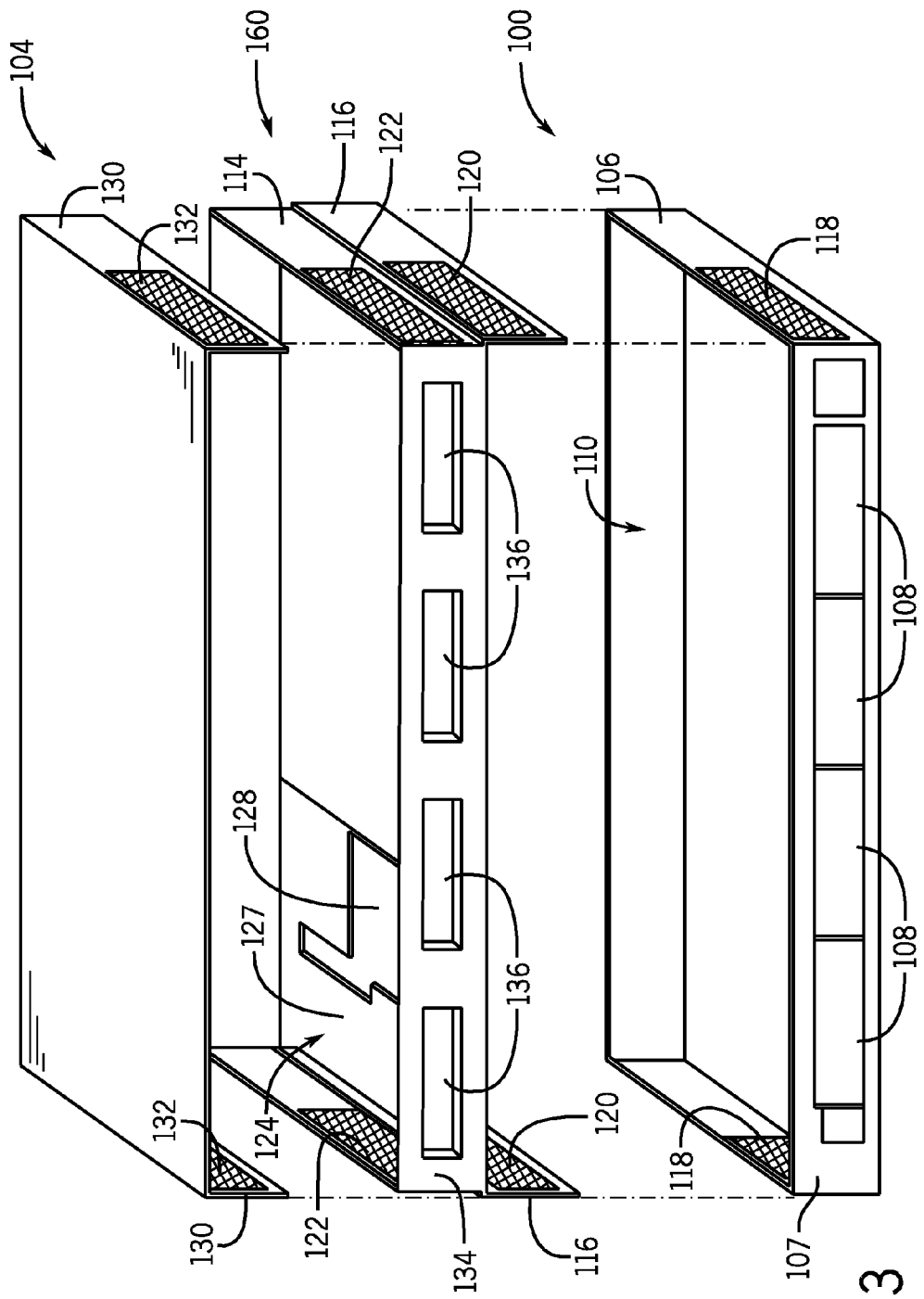
FIG. 3 is a perspective exploded view of an assembly having a base module, a chassis extension module, and a lid, according to some implementations.
Figure 4:
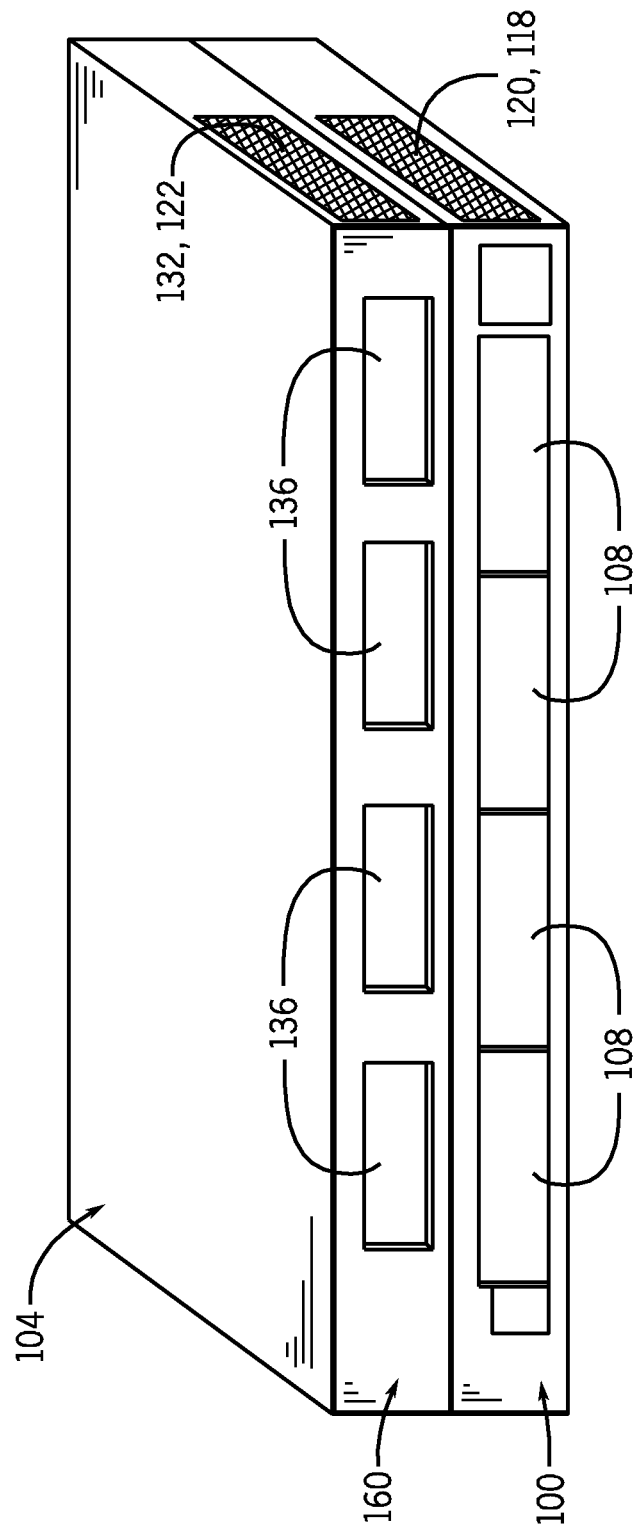
FIG. 4 is a perspective view of the assembly of FIG. 3 with the base module, chassis extension module, and lid assembled together, in accordance with some implementations.

FIG. 3 is an exploded view of an assembly that includes the base module 100, the chassis extension module 160 (of FIG. 2), and the lid 104 that can be attached together to form an assembly as shown in FIG. 4. The assembly of FIG. 4 has a form factor different from that of the base assembly of FIG. 1—for example, the assembly of FIG. 4 can have a height 2 U (as compared to the 1 U height of the base assembly). Although specific arrangements are shown in FIG. 3, it is noted that different arrangements can be used in other examples.

As depicted in FIG. 3, the base module 100 has a housing structure 106 that has side portions, a front portion (107), a rear portion, and a bottom portion. Note, however, that there is no top portion of the housing structure 106, according to some examples. In the example shown in FIG. 3, the front portion (107) of the housing structure 106 includes various connectors, ports or receptacles 108 to allow for connection to or receipt of external device(s). The housing structure 106 defines an inner volume 110 that is able to receive components.

Although not shown, the rear portion of the housing structure 106 can also be provided with connectors, ports or receptacles for connection to or receipt of external device(s) at the rear of the base module 100. Alternatively or additionally, the side portions of the housing structure 106 can be provided with connectors, ports or receptacles.

The chassis extension module 160 is provided above the base module 100. The connection portions 116 of the extension housing structure 114 of the chassis extension module 160 are designed to cover or otherwise engage with respective side portions of the base module 100. Thus, when the extension housing structure 114 of the chassis extension module 160 is attached to the base housing structure 106 of the base module 100, the connection portions 116 are engaged to respective side portions of the base housing structure 106. The connection portions 116 can be provided with attachment members to allow for the connection portions 116 to be attached to the respective side portions of the base housing structure 106. The attachment members can include openings for receiving screws, or can be any other type of attachment members, such as tabs, hooks, and so forth.

As further shown in FIG. 3, the side portions of the base module 100 are provided with air flow openings 118. To avoid obstructing airflow through the openings 118 of the side portions of the base housing structure 106 after the extension housing structure 114 is attached to the base housing structure 106, the airflow openings 120 of the connection portions 116 are aligned with the airflow openings 118 when the connection portions 116 are engaged to the side portions of the base housing structure 106. Thus, when the extension housing structure 114 is attached to the base housing structure 106, airflow can still continue to flow through the airflow openings 118, 120.

Similarly, the airflow openings 122 of the extension housing structure 114 are aligned with airflow openings 132 provided in side portions 130 of the lid 104 when the lid 104 is attached to the chassis extension module 160, to allow airflow between the inner volume of the chassis extension module 160 and the outside of the assembly (through the openings 122, 132).

As noted above, the opening(s) 128 in the support structure 127 of the chassis extension module 160 allow(s) for communication between the inner volume 124 of the chassis extension module 160 and the inner volume 110 of the base module 100. The opening(s) 128 allow(s) for direct airflow between the inner volume 124 of the chassis extension module 160 and the inner volume 110 of the base module 100. Alternatively, or additionally, the opening(s) 128 allow(s) for an electrical medium to be provided between the inner volume 124 of the chassis extension module 160 and the inner volume 110 of the base module 100. Examples of an electrical medium can include one or multiple electrical cables or a backplane. In other examples, the opening(s) 128 allow(s) for wireless communication (e.g., infrared communication) between the inner volumes of the base module 100 and the chassis extension module 160.

Figure 5:
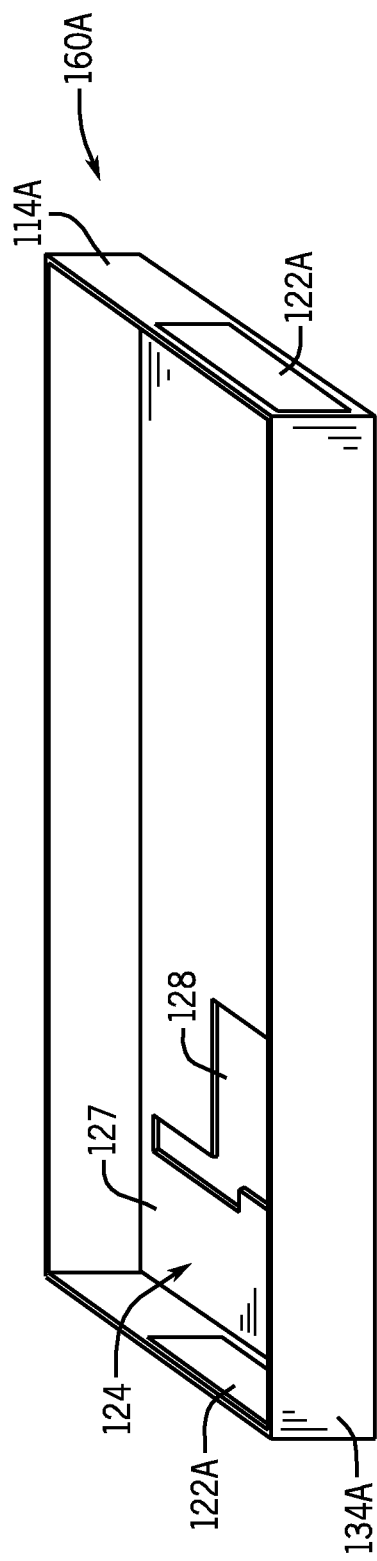
FIG. 5 is a perspective view of a chassis extension module according to alternative implementations.

In alternative implementations, instead of the chassis extension module 160 of FIG. 2 in the assembly shown in FIG. 3, a chassis extension module 160A according to FIG. 5 can be used instead. With the chassis extension module 160A of FIG. 5, various components present in the chassis extension module 160 of FIG. 2 are omitted, such as the connection portions 116 shown in FIG. 2. Also, an extension housing structure 114A of the chassis extension module 160A can be provided with a continuous slot 122A instead of the airflow openings 122 of FIG. 2. Also, a front portion 134A of the chassis extension module 160A of FIG. 5 does not include connectors, ports or receptacles (such as 136 shown in FIG. 2).

The chassis extension module 160A of FIG. 5 can be attached to tabs protruding from the top of the base module 100, or alternatively, screws or other attachment elements can attach a bottom of the chassis extension module 160A to the base module 100.

Figure 6A:
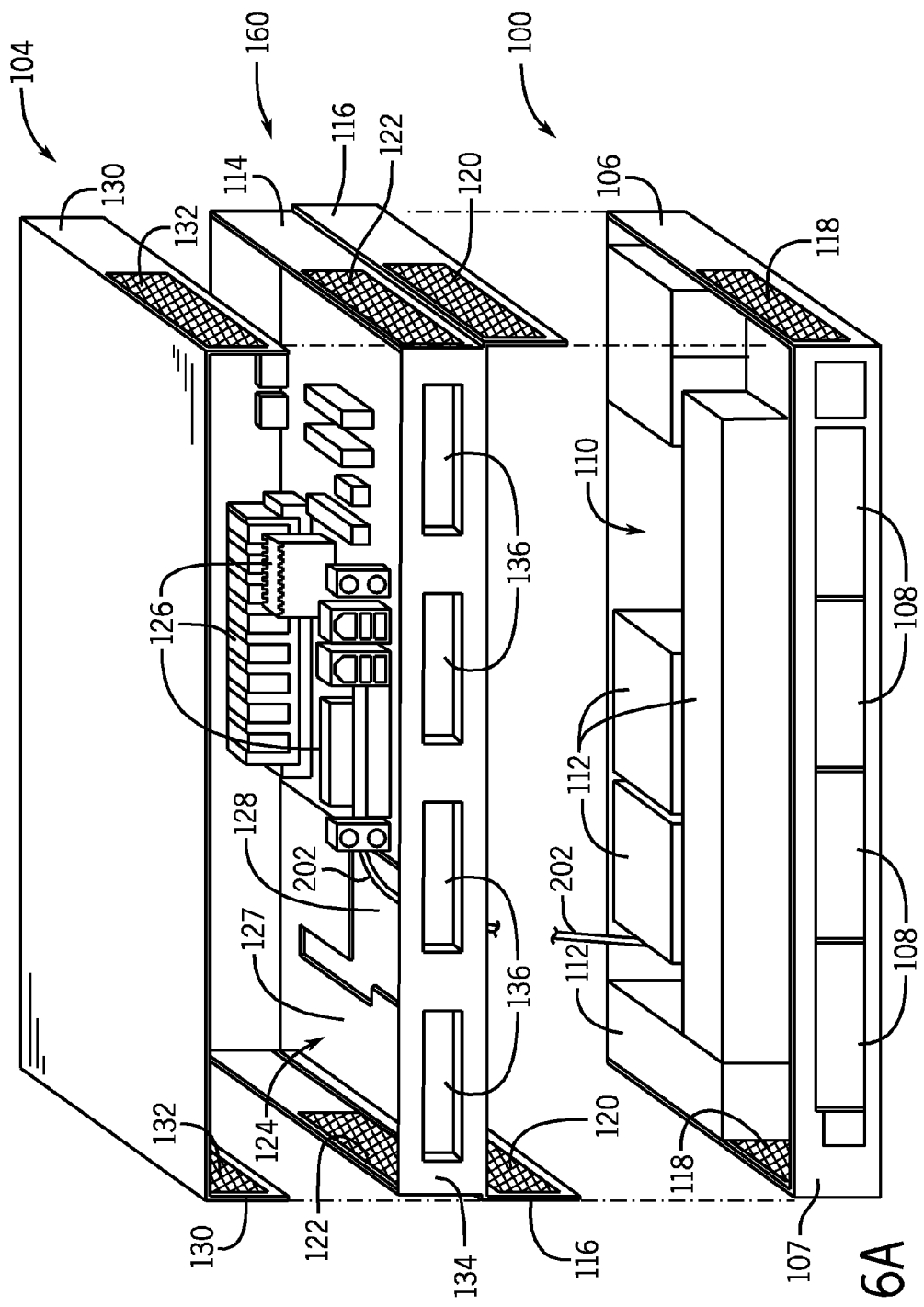
FIG. 6A is a perspective exploded view of a system having a base module, a chassis extension module, and a lid, along with electronic components in the base module and chassis extension module, in accordance with further implementations.

FIG. 6A depicts provision of electronic components into a composite inner volume of an assembly of the base module 100, chassis extension module 160, and lid 104, in accordance with further implementations. The volume 110 of the base module 100 contains electronic components 112. The electronic components 112 can be associated with a server computer, a communications switch, a storage device, or other type of device. As examples, the electronic components 112 can include any combination of one or multiple ones of the following: a processor, a memory device, a hard disk drive, a power supply, a microcontroller, a network interface controller, and so forth.

The inner volume 124 of the chassis extension module 160 contains electronic components 126. The electronic components 126 in the chassis extension module 160 can be identical to or different from the electronic components 112 of the base module 100. If identical, the electronic components 126 are provided to allow for redundancy such that the electronic components 126 are available in case the electronic components 112 of the base module 100 fail or experience another fault. Alternatively, if the electronic components 126 are different from the electronic components 112 of the base module 100, the electronic components 126 add additional capabilities or capacity not available with the electronic components 112 in the base module 100.

As noted above, an electrical medium can be provided through the opening(s) 128 of the support structure 127 of the chassis extension module 160. Examples of an electrical medium can include one or multiple electrical cables (e.g. 202 in FIG. 6A) or a backplane. Electrical cable(s) can be connected to connectors of the electronic components 126 and electronic components 112. If the electrical medium is a backplane, then a backplane circuit board can be extended through the opening 128, with the backplane having connectors to connect to respective ones of the electronic components 126 and electronic components 112.

In alternative examples, the opening(s) 128 can also be used to communicate wireless signaling between electronic components 126 and electronic components 112.

Figure 6B:
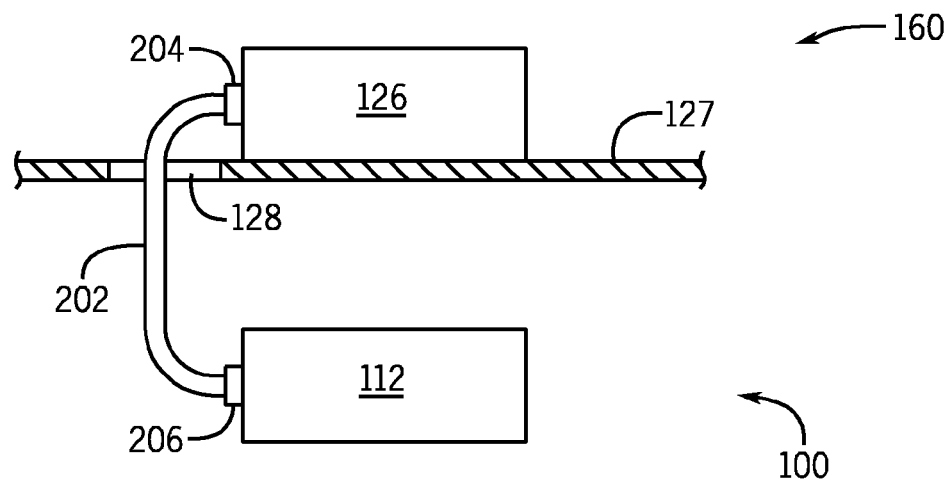
FIGS. 6B-6D are schematic views of interconnections between electronic components in different modules, in accordance with some implementations.

FIG. 6B is a schematic side or front view of a portion of an assembly that has the base module 100 and chassis extension module 160 (in which electronic components 112 and 126, respectively, have been provided). As shown, an electronic component 126 in the chassis extension module 160 is supported by the support structure 127. The opening 128 in the support structure 127 allows for an electrical cable 202 to extend between the electronic component 126 and an electronic component 112 in the base module 100. On one side, the electrical cable is connected by a connector 204 to the extension chassis module electronic component 126, and on the other side, the electrical cable 202 is connected by a connector 206 to the base module electronic component 112.

Figure 6C:
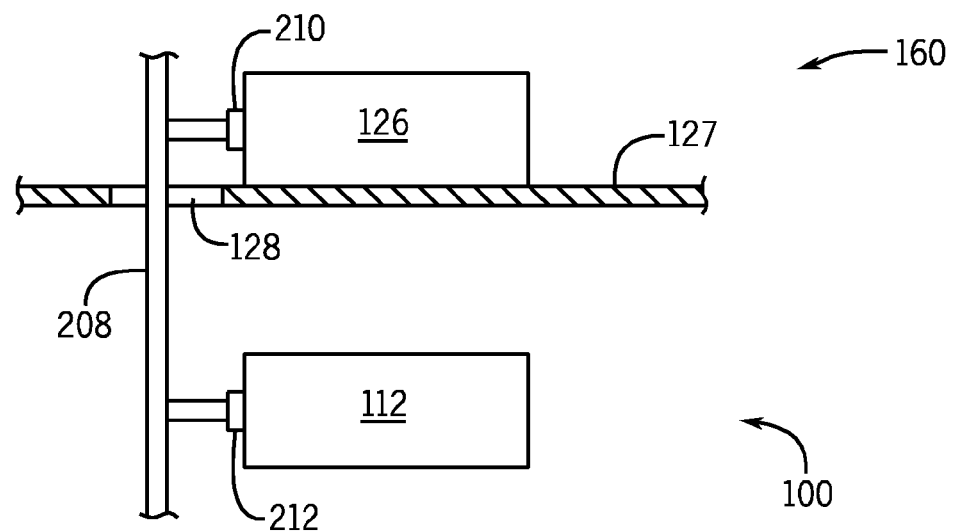

FIG. 6C shows an alternative implementation, in which a backplane circuit assembly 208 is provided through the opening 128 of the support structure 127. Connectors 210 and 212 allow the extension module electronic component 126 and base module electronic component 112 to connect respectively to the backplane circuit assembly 208.

Figure 6D:
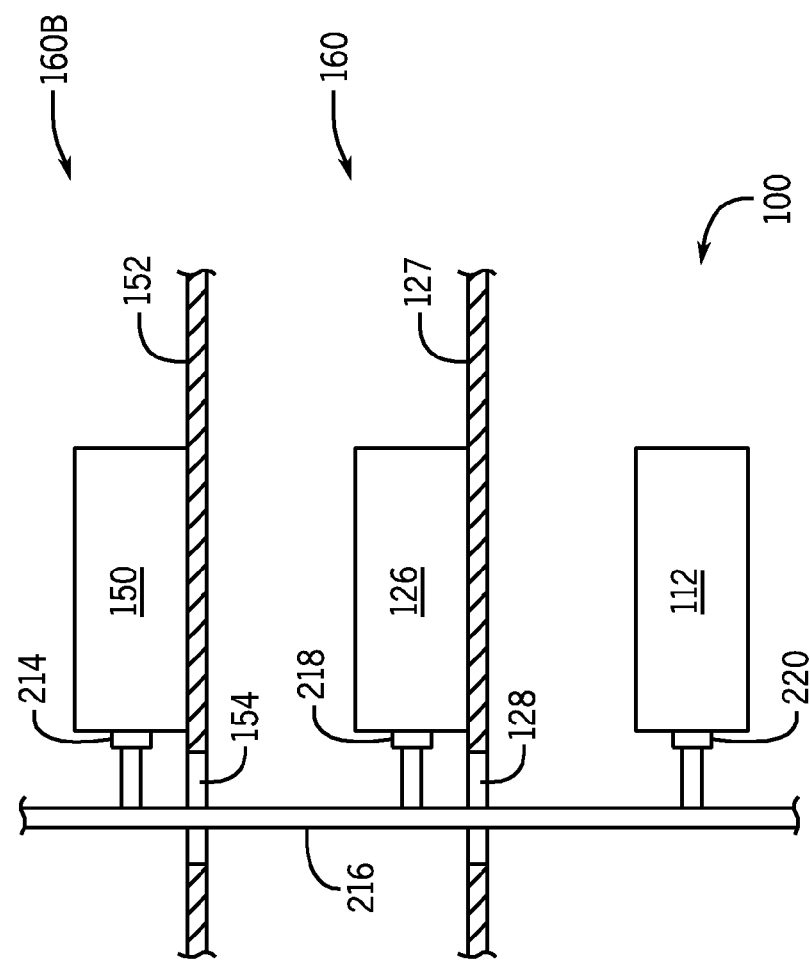

A further example is shown in FIG. 6D, which shows a portion of an assembly that includes the base module 100, the chassis extension module 160, and another chassis extension module 160B. The second chassis extension module 160B is attached to the first chassis extension module 160 in similar fashion as the chassis extension module 160 is attached to the base module 100. When the second chassis extension module 160B is attached to the first chassis extension module 160, the composite inner volume of the assembly (which now includes the base module 100 and the chassis extension modules 160 and 160B) is expanded by the inner volume of the second chassis extension module 160B. In other words, the composite inner volume of the assembly is increased from an inner volume that includes the aggregate of the inner volumes of the first chassis extension module 160 and base module 100 to a larger composite inner volume that includes the aggregate of the inner volumes of the chassis extension modules 160, 160B and the base module 100.

In the example of FIG. 6D, an electronic component 150 of the second chassis extension module 160B is supported on a support structure 152, which has an opening 154. The second chassis extension module 150 is connected by a connector 214 to a backplane circuit assembly 216. Similarly, the first chassis extension module component 126 and the base module electronic component 112 are connected by respective connectors 218 and 220 to the backplane circuit assembly 216. The backplane circuit assembly 216 extends through the openings 154 and 128 of respective support structures 152 and 127.

In alternative implementations, instead of using the backplane circuit assembly 216 in the FIG. 6D arrangement, electrical cables can be used instead to connect the electronic components 112, 126, and 150.

Although the foregoing depicts assemblies where chassis extension module(s) is (are) added to increase the height of the respective assembly, it is noted that in alternative implementations chassis extension module(s) can be added to increase the width and/or depth and/or height of the respective assembly.

Figure 7:
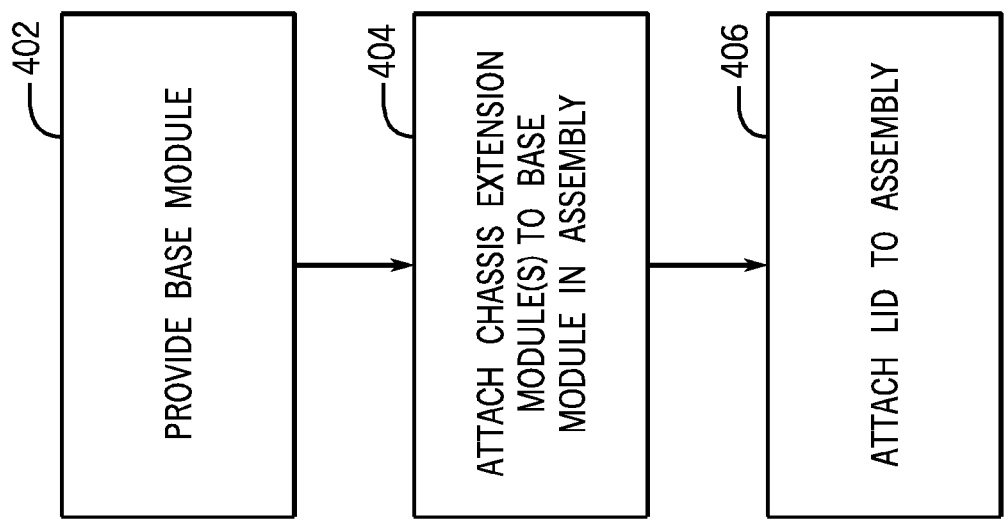
FIG. 7 is a flow diagram of building an assembly, according to some implementations.

FIG. 7 is a flow diagram of a process of building an assembly using the modular approach according to some implementations. First, a base module 100 is provided (at 402) in the assembly, where the base module 100 has the base housing structure 106 as depicted in FIG. 3. One or multiple chassis extension modules (160 and/or 160A and/or 160B) are attached (404) in the assembly. The lid 104 is then attached (at 406) to the assembly.

A benefit offered by some implementations is that common tooling can be shared for building different assemblies having different chassis configurations. The ability to use the same tooling to build different chassis configurations can result in reduced manufacturing costs and increased efficiencies. Also, by using a modular approach of building assemblies according to different specifications, the number of unique chassis parts that would have to be maintained by a manufacturer can be reduced, thereby further reducing costs.

In the foregoing description, numerous details are set forth to provide an understanding of the subject disclosed herein. However, implementations may be practiced without some or all of these details. Other implementations may include modifications and variations from the details discussed above. It is intended that the appended claims cover such modifications and variations.

What is claimed is:

1. A chassis extension module comprising:
    a support structure comprising a floor, the floor including an opening;
    an extension housing structure defining an inner volume, wherein the support structure is attached to the extension housing structure, and the extension housing structure includes a front portion, side portions, and a rear portion, at least one of the side portions including an airflow opening, and at least one of the front and rear portions including a connector or port for connection to a device,
    wherein the extension housing structure is configured to be provided in an assembly by attaching to a second housing structure of a second module, and wherein the extension housing structure upon attachment to the second housing structure provides an expansion of an inner volume of the assembly.

2. The chassis extension module of claim 1, wherein the opening is arranged to pass an electrical medium between the inner volume of the extension housing structure and an inner volume of the second housing structure.

3. The chassis extension module of claim 2, wherein the opening is arranged to pass the electrical medium that comprises an electrical cable or a backplane.

4. The chassis extension module of claim 2, wherein the opening is arranged to pass wireless communication between the inner volume of the extension housing structure and the inner volume of the second housing structure.

5. The chassis extension module of claim 2, wherein the opening is arranged to provide air flow between the inner volume of the extension housing structure and the inner volume of the second housing structure.

6. The chassis extension module of claim 1, wherein the extension housing structure is configured to be attached to a second extension housing structure of a second chassis extension module, wherein the second chassis extension module forms part of the assembly such that the inner volume of the assembly is expanded by an inner volume of the second extension housing structure.

7. The chassis extension module of claim 1, wherein the opening is arranged to pass a backplane circuit board for connection to the connector or port of the at least one of the front and rear portions of the extension housing structure.

8. A method comprising:
    providing a first module having a first housing structure; and
    attaching a chassis extension module to the first module that together are part of an assembly, wherein the chassis extension module has an extension housing structure and a support structure, and wherein the extension housing structure upon attachment to the first housing structure is configured to expand a composite inner volume of the assembly, the support structure comprising a floor, the floor including an opening, and the extension housing structure including a front portion, side portions, and a rear portion, at least one of the side portions including an airflow opening, and at least one of the front and rear portions including a connector or port for connection to a device.

9. The method of claim 8, further comprising attaching a lid to the extension housing structure to cover the composite inner volume of the assembly.

10. The method of claim 9, further comprising:
    detaching the chassis extension module from the first module, wherein detaching the chassis extension module causes reduction of the composite inner volume of the assembly; and
    attaching the lid to the first housing structure to cover the reduced composite inner volume of the assembly.

11. The method of claim 8, wherein the opening in the floor allows for air flow between the first module and the chassis extension module.

12. The method of claim 11, further comprising:
    passing an electrical medium through the opening to electrically connect respective electronic components contained in the first module and the chassis extension module.

13. The method of claim 8, wherein attaching the chassis extension module to the first module comprises attaching the chassis extension module containing an electronic component that is of a different type from an electronic component contained in the first module.

14. The method of claim 8, wherein attaching the chassis extension module to the first module comprises attaching the chassis extension module containing an electronic component that is of the same type as an electronic component contained in the first module.

15. The method of claim 8, wherein the chassis extension module is a first chassis extension module, the method further comprising:
    attaching a second chassis extension module to the first chassis extension module, wherein the second chassis extension module has a second extension housing structure, and
    wherein attaching the second chassis extension module to the first chassis extension module increases the composite inner volume of the assembly by an inner volume of the second extension housing structure.

16. The method of claim 8, wherein the assembly is a first assembly, the method further comprising building a second assembly that includes another first module, wherein the second assembly has a chassis configuration that is different from a chassis configuration of the first assembly, and wherein building the first and second assemblies share common manufacturing tooling.

17. A system comprising:
    a base module having a base housing structure defining an inner volume;
    a first electronic component contained in the inner volume of the base housing structure; and
    a chassis extension module having an extension housing structure defining an inner volume and a support structure attached to the extension housing structure, wherein the extension housing structure is attached to the base housing structure, the support structure comprising a floor, the floor including an opening, and the extension housing structure including a front portion, side portions, and a rear portion, at least one of the side portions including an airflow opening, and at least one of the front and rear portions including a connector or port for connection to a device; and
    a second electronic component contained in the inner volume of the extension housing structure,
    wherein a composite inner volume of the system is made up of the inner volume of the base housing structure and the inner volume of the extension housing structure, and wherein the inner volume of the base housing structure is in communication with the inner volume of the extension housing structure.

18. The system of claim 17, further comprising an electrical medium passing through the opening to electrically connect the respective electronic components in the base module and in the chassis extension module.

19. The system of claim 17, wherein the first electronic component in the base module and the second electronic component in the chassis extension module are to communicate wirelessly with each other through the opening.

20. The system of claim 18, wherein the opening enables airflow between the inner volumes of the base module and the chassis extension module.

21. The system of claim 17, further comprising a backplane circuit board passing through the opening, the backplane circuit board connected to the connector or port of the at least one of the front and rear portions of the extension housing structure.

* * * * *